United States Patent
Adachi et al.

(10) Patent No.: US 7,378,915 B2
(45) Date of Patent: May 27, 2008

(54) DIELECTRIC RESONATOR OSCILLATOR AND RADAR APPARATUS USING THE SAME

(75) Inventors: Takuya Adachi, Tokyo (JP); Hitoyoshi Kurata, Tokyo (JP)

(73) Assignee: TDK Corporation (JP)

( * ) Notice: Subject to any disclaimer, the term of this patent is extended or adjusted under 35 U.S.C. 154(b) by 136 days.

(21) Appl. No.: 11/366,304

(22) Filed: Mar. 1, 2006

(65) Prior Publication Data
US 2006/0202770 A1 Sep. 14, 2006

(30) Foreign Application Priority Data
Mar. 8, 2005 (JP) ............................. 2005-063285
Jan. 13, 2006 (JP) ............................. 2006-006716

(51) Int. Cl.
*H03B 9/14* (2006.01)
(52) U.S. Cl. ..................... 331/117 D; 331/107 DP
(58) Field of Classification Search ........... 331/117 D, 331/107 DP; 333/219.1
See application file for complete search history.

(56) References Cited

U.S. PATENT DOCUMENTS

| | | | |
|---|---|---|---|
| 6,157,269 A * | 12/2000 | Orr | 331/117 D |
| 6,535,072 B2 * | 3/2003 | Yamashita et al. | 331/107 G |
| 6,897,735 B2 * | 5/2005 | Nagasaku et al. | 331/117 D |
| 2004/0183604 A1 * | 9/2004 | Ammar et al. | 331/107 DP |

FOREIGN PATENT DOCUMENTS

JP        07-318639        12/1995

* cited by examiner

*Primary Examiner*—Joseph Chang
(74) *Attorney, Agent, or Firm*—Young Law Firm, P.C.

(57) ABSTRACT

At least one of a rise time and a fall time of a dielectric resonator oscillator are reduced. The dielectric resonator oscillator includes a dielectric resonator, a drive circuit for applying a resonance voltage to the dielectric resonator, a switch for applying a voltage required for generating the resonance voltage to the drive circuit, a switch for applying a ground voltage for stopping generation of the resonance voltage to the drive circuit, and a capacitor connected to a power terminal side that supplies a voltage, as seen from the switch, for removing noise generated by the drive circuit. If these switches are made conductive exclusively, oscillation can be stopped immediately by turning on the switch. Since the capacitor is in a charge storage state at all times, regardless of ON/OFF of the switch, the oscillation operation can be started immediately when the switch is turned ON.

24 Claims, 9 Drawing Sheets

DIELECTRIC RESONATOR OSCILLATOR AND RADAR APPARATUS USING THE SAME

TECHNICAL FIELD

The present invention relates to a dielectric resonator oscillator, and more specifically, relates to a dielectric resonator oscillator suitable for application to a radar apparatus using a pulse modulation method. Furthermore, the present invention relates to a radar apparatus, and more specifically, relates to a radar apparatus that generates a carrier signal by using the dielectric resonator oscillator, and generates and outputs pulse modulated waves.

BACKGROUND OF THE INVENTION

Recently, many types of radar apparatuses using microwaves and millimeter waves have been proposed. While the application range of the radar apparatuses is diversified, if the radar apparatus is mounted on a vehicle, not only a distance between a preceding or following vehicle and the vehicle with the radar apparatus can be accurately detected, but also an obstacle present at a position in a blind spot of a driver, for example, an obstacle located diagonally backward or near a bumper can be detected to warn the driver, or an unavoidable collision closing on is detected to perform a pre-crash control, such as fastening a seat belt.

When such a radar apparatus is mounted in many vehicles, a problem of interference between the radar apparatuses occurs. That is, when vehicles having the radar apparatus mounted thereon approach each other, or when a plurality of radar apparatuses is mounted on the same vehicle, since the distance between the radar apparatuses is short, a strong interference occurs. As a result, accurate measurement cannot be performed.

As a method of preventing the interference between the radar apparatuses, for example, a method disclosed in Japanese Patent Application Laid-Open No. H7-318639 is known. In the method described in the above application, an interference preventing apparatus that receives an interference wave, inverts the phase thereof, and retransmits the wave is installed. However, to prevent interference over a wide range, there is a problem that many interference preventing apparatuses must be installed, as well as a problem that interference cannot be prevented at all in an area where the interference preventing apparatus is not installed. Furthermore, in the case of vehicle radar, the position between the radar apparatuses is not always constant, and hence, it is difficult to solve the problem of interference with the method described in the above publication.

SUMMARY OF THE INVENTION

As another method of solving the problem of interference, when a radar apparatus using a pulse modulation method is used, there can be considered a method of stopping generation of a carrier signal in a period during which transmitting and receiving operation is not performed. Generally, in the radar apparatus using the pulse modulation method, the period during which the transmitting and receiving operation is not performed is much longer than a period during which the transmitting and receiving operation is performed. Therefore, if generation of the carrier signal is stopped in the period during which the transmitting and receiving operation is not performed, the influence of interference on other radar apparatuses can be considerably reduced.

However, since a certain pulse rise time is present in an oscillation circuit for generating the carrier signal, resumption of operation of the once stopped oscillation circuit should be performed earlier, taking the pulse rise time into consideration. Specifically, it is necessary to start the operation of the oscillation circuit, before timing for actually starting transmitting and receiving by at least the pulse rise time of the oscillation circuit. On the other hand, since a certain fall time is present in the oscillation circuit, even when the operation of the oscillation circuit is stopped, oscillation continues until the fall time has passed.

Thus, it is seen that when the rise time and the fall time of the oscillation circuit are long, the period during which the oscillation circuit actually oscillates becomes long. Accordingly, to reduce the influence of interference on other radar apparatuses sufficiently, it is necessary to reduce the rise time and the fall time of the oscillation circuit as much as possible.

In the radar apparatus using the pulse modulation method, an oscillation circuit using a dielectric resonator, that is, a dielectric resonator oscillator has been widely used as the oscillation circuit for generating the carrier signal. However, in the dielectric resonator oscillator, particularly the fall time is long, and hence, to reduce the influence of interference on other radar apparatuses sufficiently, it is strongly required to reduce the fall time.

The present invention has been achieved to solve the above problems. Therefore, it is an object of the invention to provide a dielectric resonator oscillator having at least one of a short rise time and a short fall time, and a radar apparatus using the same.

The dielectric resonator oscillator according to the present invention includes a dielectric resonator, a drive circuit for applying a resonance voltage to the dielectric resonator, and a means for applying a first voltage required for generating the resonance voltage and a second voltage for stopping generation of the resonance voltage to the drive circuit.

According to the present invention, when oscillation is to be started, the first voltage is applied to the drive circuit, and when the oscillation is to be stopped, the second voltage is applied to the drive circuit. Accordingly, at least one of the rise time and the fall time can be reduced.

The drive circuit preferably includes a transistor, and a first and a second signal lines respectively connected to a controlled electrode and a control electrode of the transistor.

The applying means preferably includes a first switch provided between the controlled electrode of the transistor and a first power terminal to which the first voltage is supplied, and a second switch provided between the controlled electrode of the transistor and a second power terminal to which the second voltage is supplied. It is preferred that the first and the second switches are made conductive exclusively. Accordingly, when the oscillation is to be stopped, charges stored in the controlled electrode of the transistor can be discharged by turning on the second switch. Accordingly, the fall time can be considerably reduced.

In this case, it is preferred to further include a capacitor for removing noise generated by the drive circuit, connected to the first power terminal side as seen from the first switch. Accordingly, the capacitor is in a charge storage state at all times, regardless of ON/OFF of the first switch. Accordingly, when the first switch is switched on, the oscillation operation can be performed immediately, thereby enabling reduction of the rise time.

It is further preferred that the applying means includes a voltage divider circuit provided between the control electrode of the transistor and a third power terminal, and a third switch for turning a partial voltage ratio of the voltage divider circuit. Accordingly, since a bias voltage applied to the control electrode of the transistor can be immediately changed by switching the partial voltage ratio, both the rise time and the fall time can be reduced.

In this case, the voltage divider circuit can have a configuration in which first and second resistances are serially provided between the control electrode of the transistor and the third power terminal, and the third switch is connected to the first resistance in parallel. Alternatively, the configuration can be such that the voltage divider circuit includes first and second resistances provided in parallel between the control electrode of the transistor and the third power terminal, and the third switch is serially connected to the first resistance.

It is further preferable that the applying means includes a control terminal connected to the control electrode of the transistor for controlling the start and suspension of the oscillation operation due to a voltage change. Accordingly, since the start and suspension of the oscillation operation can be controlled without using a switch, the circuit configuration can be further simplified. The connection between the control electrode and the control terminal can be direct, or indirect via a capacitor and a chip bead.

The dielectric resonator oscillator according to another aspect of the present invention includes a dielectric resonator, a drive circuit for applying a resonance voltage to the dielectric resonator, a switch provided between the power terminal to which a voltage required for generating a resonance voltage is supplied and the drive circuit, and a capacitor connected to the power terminal side as seen from the switch, for removing noise generated by the drive circuit. Accordingly, the capacitor is in the charge storage state at all times, regardless of ON/OFF of the switch. Accordingly, when the switch is turned on, the oscillation operation can be performed immediately, thereby enabling reduction of the rise time.

The radar apparatus according to the present invention uses the dielectric resonator oscillator to generate the carrier signal, and generates and outputs a pulse modulation wave.

According to the present invention, at least one of the rise time and the fall time of the dielectric resonator oscillator can be reduced. Accordingly, if the dielectric resonator oscillator according to the present invention is used as an oscillation circuit for the radar apparatus using the pulse modulation method, when intermittent operation is performed, the period during which oscillation is actually generated can be reduced than in the conventional dielectric resonator oscillator. As a result, the influence of interference on other radar apparatuses can be considerably reduced.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Prior to the explanation of the preferred embodiments of the present invention, a basic configuration of a dielectric resonator oscillator will now be explained.

Figure 1:
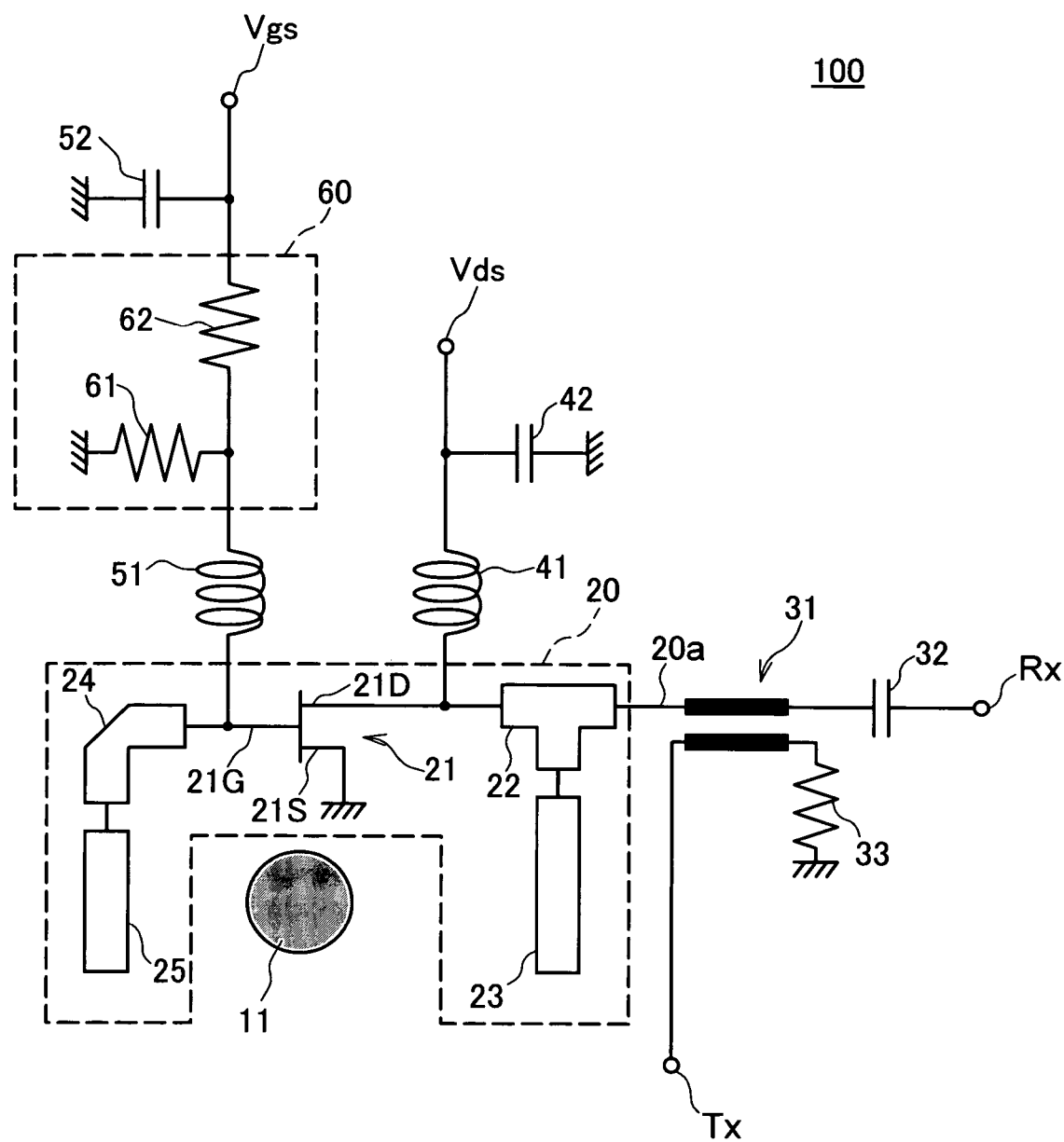
FIG. 1 is a circuit diagram of a basic configuration of a dielectric resonator oscillator.

FIG. 1 is a circuit diagram of a basic configuration of a dielectric resonator oscillator.

A dielectric resonator oscillator 100 shown in FIG. 1 includes a dielectric resonator 11, a drive circuit 20 for applying a resonance voltage to the dielectric resonator 11, and a coupler 31 connected to an output terminal 20a of the drive circuit 20. One output terminal of the coupler is connected to a reception side port Rx via a capacitor 32 that cuts DC components, and the other output terminal of the coupler is connected to a transmission side port Tx. A remaining terminal of the coupler is terminated at, for example, 50Ω by a terminating resistance.

The drive circuit 20 includes an HEMT transistor 21, signal lines 22 and 23 connected to a drain 21D, which is a controlled electrode of the transistor 21, and signal lines 24 and 25 connected to a gate 21G, which is a control electrode of the transistor 21. The dielectric resonator 11 is arranged between the signal line 23 connected to the drain 21D and the signal line 25 connected to the gate 21G. A source 21S of the transistor 21 is connected to a ground potential.

The operation voltage of the transistor 21 is supplied from a power terminal Vds and a power terminal Vgs. The power terminal Vds supplies a voltage to the drain 21D of the transistor 21, and a chip bead 41 is inserted between the power terminal Vds and the drain 21D of the transistor 21. On the power terminal Vds side as seen from the chip bead 41, a capacitor 42 is connected between the power terminal Vds and the ground potential. The chip bead 41 and the capacitor 42 are used for removing the noise generated by the drive circuit 20. The voltage applied from the power terminal Vds is for example 3.3V.

On the other hand, the power terminal Vgs supplies a voltage to the gate 21G of the transistor 21, and a chip bead 51 and a voltage divider circuit 60 are inserted between the power terminal Vgs and the gate 21G of the transistor 21. On the power terminal Vgs side as seen from the voltage divider circuit 60, a capacitor 52 is connected between the power terminal Vgs and the ground potential. The voltage divider circuit 60 is formed of resistances 61 and 62, and divides the voltage provided from the power terminal Vgs and applies the partial voltage to the gate 21G of the transistor 21. The voltage provided from the power terminal Vgs is for example −3.3V, and for example, a voltage of −0.3V is applied to the gate 21G of the transistor 21, due to partial voltage by the voltage divider circuit 60. The chip bead 51 and the capacitor 52 are used for removing the noise generated by the drive circuit 20.

The dielectric resonator oscillator 100 shown in FIG. 1 constitutes a positive-feedback circuit in which the drain 21D of the transistor 21 is used for an output, and the resonance voltage fed back via the dielectric resonator 11 is input to the gate 21G of the transistor 21. Therefore, the positive-feedback circuit is stabilized at a predetermined resonance frequency, for example, a resonance frequency of 24 GHz, determined according to the characteristic of the dielectric resonator 11, and can supply the carrier signal to the reception side port Rx and the transmission side port Tx via the coupler 31.

The dielectric resonator oscillator has such a basic configuration, and can be used as an oscillation circuit for the radar apparatus using the pulse modulation method. That is, by using such a dielectric resonator oscillator, the carrier signal can be generated, and a pulse modulation wave can be generated and output. If the oscillation operation is performed in a period during which the radar apparatus is performing transmitting and receiving operation, and stopped in a period during which the radar apparatus is not performing transmitting and receiving operation, the influence of interference on other radar apparatuses can be considerably reduced.

Figure 2:
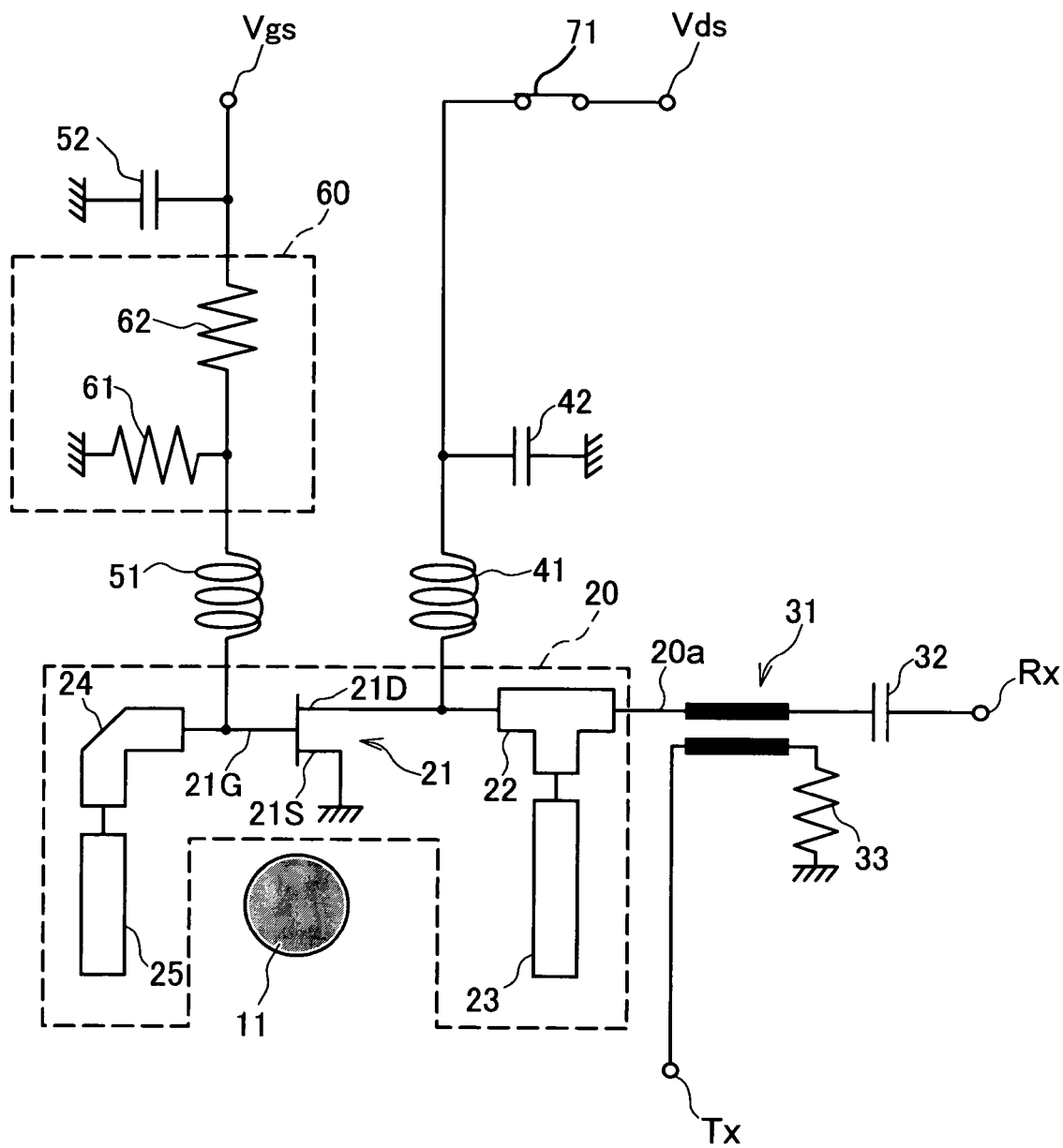
FIG. 2 is a circuit diagram of a configuration of a dielectric resonator oscillator that an intermittent operation can be performed.

Such an intermittent operation can be realized by inserting a switch 71 between the drain 21D of the transistor 21 and the power terminal Vds and controlling this switch 71, such as a dielectric resonator oscillator 200 shown in FIG. 2. In other words, the operation voltage is supplied to the drain 21D of the transistor 21 by turning on the switch 71 in the period during which the oscillation operation is performed, and supply of the operation voltage can be stopped by turning off the switch 71 in the period during which the oscillation operation is not performed.

However, when the oscillation operation of the dielectric resonator oscillator 200 is started or stopped by controlling the switch 71, a predetermined rise time is required since turning on the switch 71 until a sufficient amplitude (for example, 90% of the maximum amplitude) is obtained. Likewise, a predetermined fall time is required since turning off the switch 71 until the oscillation substantially stops (for example, 10% of the maximum amplitude). In the dielectric resonator oscillator 200 shown in FIG. 2, the fall time is particularly long, and as an example, when the resonance frequency is set to about 24 GHz, the rise time is about 15 µsec and the fall time is about 35 µsec.

The present invention is to provide a dielectric resonator oscillator in which at least one of the rise time and the fall time is reduced. Several preferred embodiments of the present invention will be explained below in detail.

Figure 3:
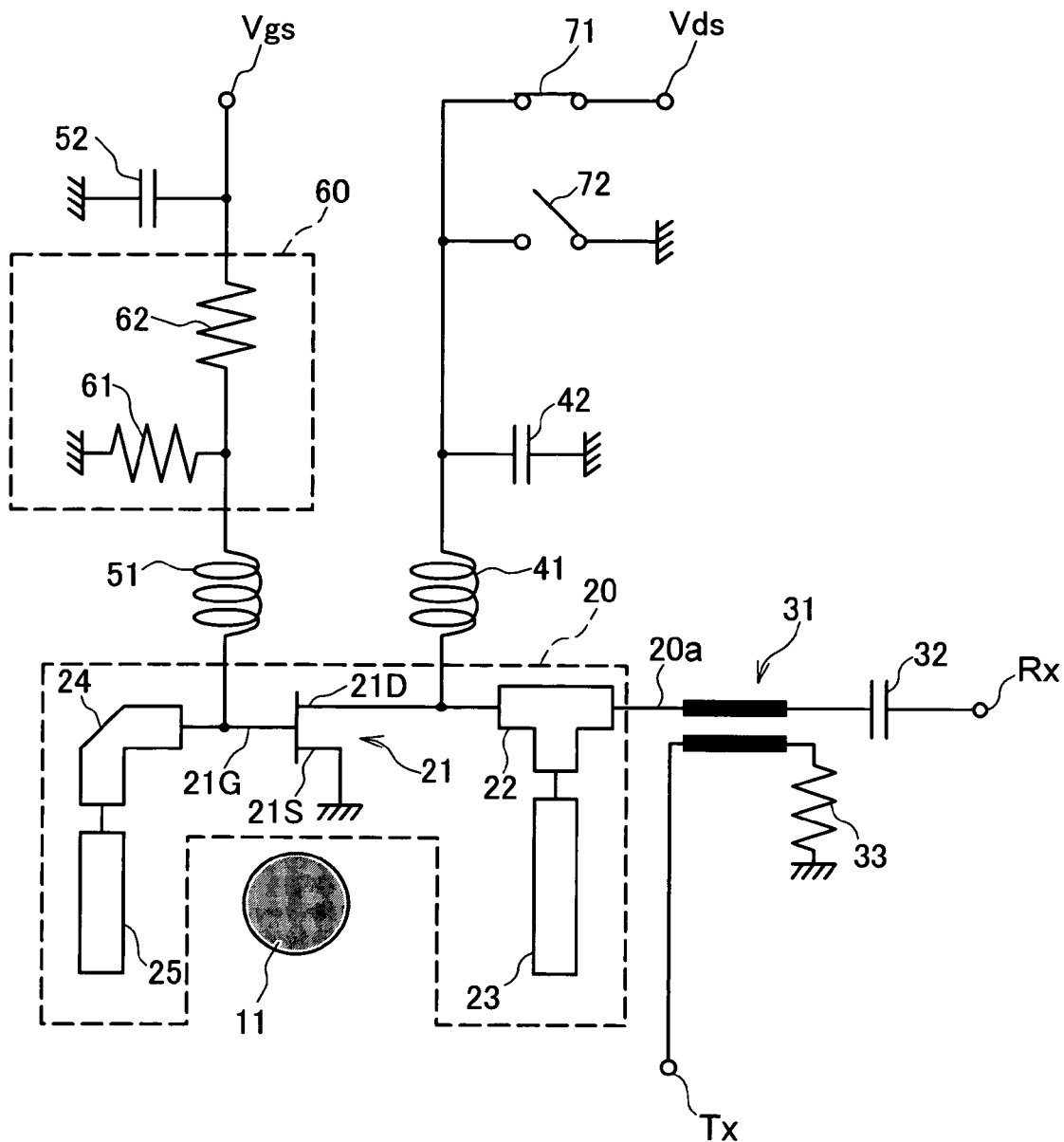
FIG. 3 is a circuit diagram of a dielectric resonator oscillator according to a preferred first embodiment of the present invention.

FIG. 3 is a circuit diagram of a dielectric resonator oscillator 300 according to a preferred first embodiment of the present invention.

As shown in FIG. 3, the dielectric resonator oscillator 300 according to the first embodiment has a configuration in which a switch 72 is additionally provided between the drain 21D of the transistor 21 and the power terminal to which the ground potential is supplied, with respect to the dielectric resonator oscillator 200 shown in FIG. 2. Other components are the same as in the dielectric resonator oscillator 200 shown in FIG. 2, and hence, like reference numerals are designated to refer to like components, and redundant explanations are omitted.

The switches 71 and 72 are controlled so as to become conductive exclusively. In other words, while the switch 71 is in the ON state, that is, in the period during which the oscillation operation is performed, the switch 72 is in the OFF state, and while the switch 72 is in the ON state, that is, in the period during which the oscillation operation is stopped, the switch 71 is in the OFF state.

In the first embodiment, when the switch 72 is turned on, the drain 21D of the transistor 21 is forcibly grounded. Therefore, when the switch 72 is turned on, the oscillation operation is quickly stopped. That is, in the circuit shown in FIG. 2, even when the switch 71 is switched from ON to OFF, there is no route for discharging the charges stored in the drain 21D of the transistor 21, and hence, the oscillation operation is not immediately stopped and gradually attenuates. However, in the first embodiment, since the charges stored in the drain 21D of the transistor 21 can be immediately discharged via the switch 72, the fall time can be considerably reduced. As one example, when the resonance frequency is about 24 GHz, the fall time is reduced to about 3 µsec.

Figure 4:
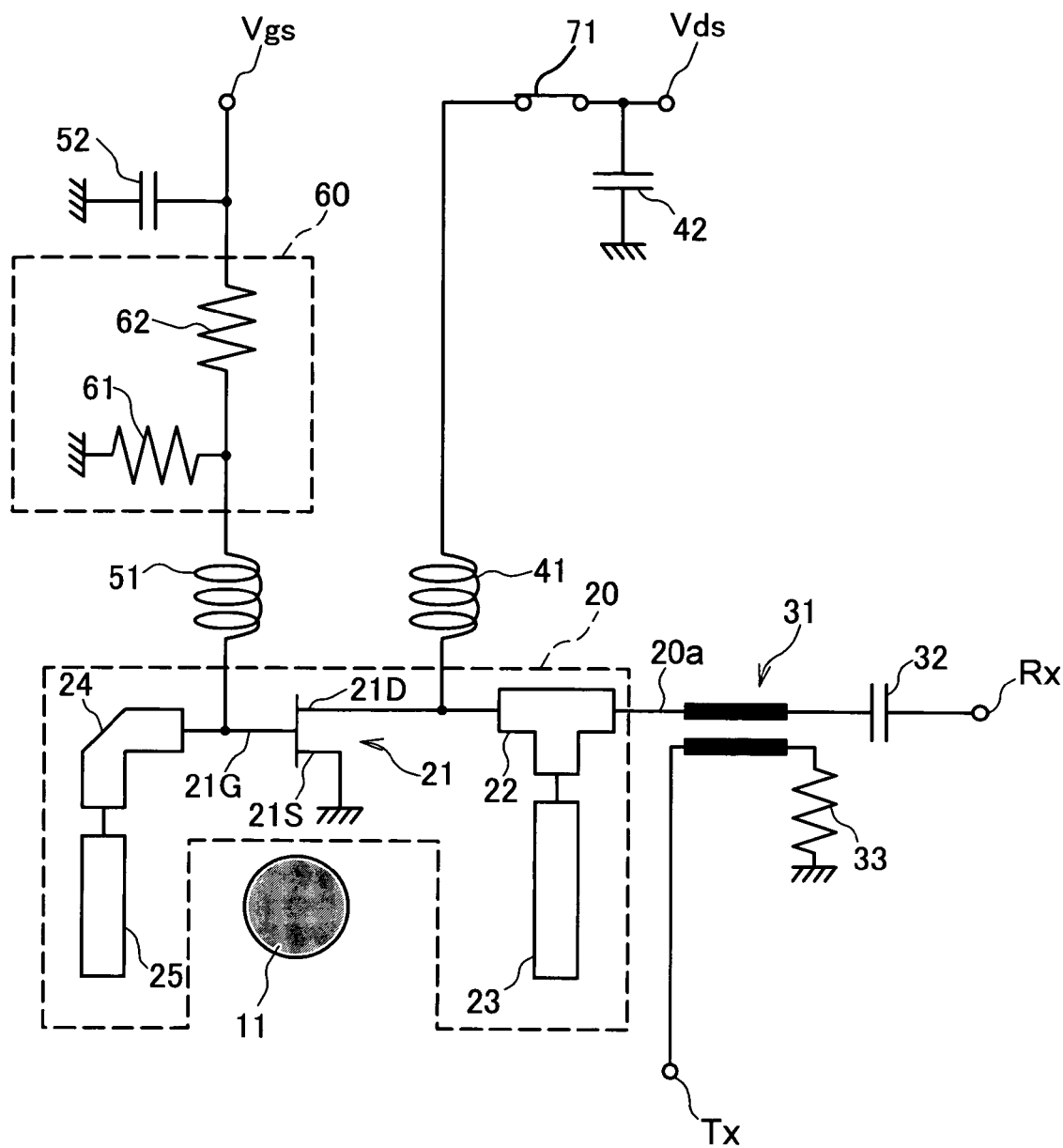
FIG. 4 is a circuit diagram of a dielectric resonator oscillator according to a preferred second embodiment of the present invention.

FIG. 4 is a circuit diagram of a dielectric resonator oscillator 400 according to a preferred second embodiment of the present invention.

As shown in FIG. 4, the dielectric resonator oscillator 400 according to the second embodiment has a configuration in which the capacitor 42 for removing noise is shifted toward the power terminal Vds side as seen from the switch 71. Other components are the same as in the dielectric resonator oscillator 200 shown in FIG. 2, and hence, like reference numerals are designated to refer to like components, and redundant explanations are omitted.

The switch 71 is turned on in the period during which the oscillation operation is performed, and turned off in the period during which the oscillation operation is stopped. In the second embodiment, since the capacitor 42 for removing noise is provided on the power terminal Vds side as seen from the switch 71, the capacitor 42 is in the charge storage state, regardless of ON/OFF of the switch 71. Therefore, when the switch 71 is turned on, the oscillation operation can be immediately started, thereby reducing the rise time.

In other words, in the circuit shown in FIG. 2, even when the switch 71 is switched from OFF to ON, normal oscillation operation cannot be performed until the capacitor 42 in the discharged state is charged, thereby causing a problem that the rise time becomes long. In the second embodiment, however, since the capacitor 42 is not discharged, recharge is not required. As a result, the rise time can be considerably reduced. As one example, when the resonance frequency is about 24 GHz, the rise time can be reduced to about 8 µsec.

Figure 5:
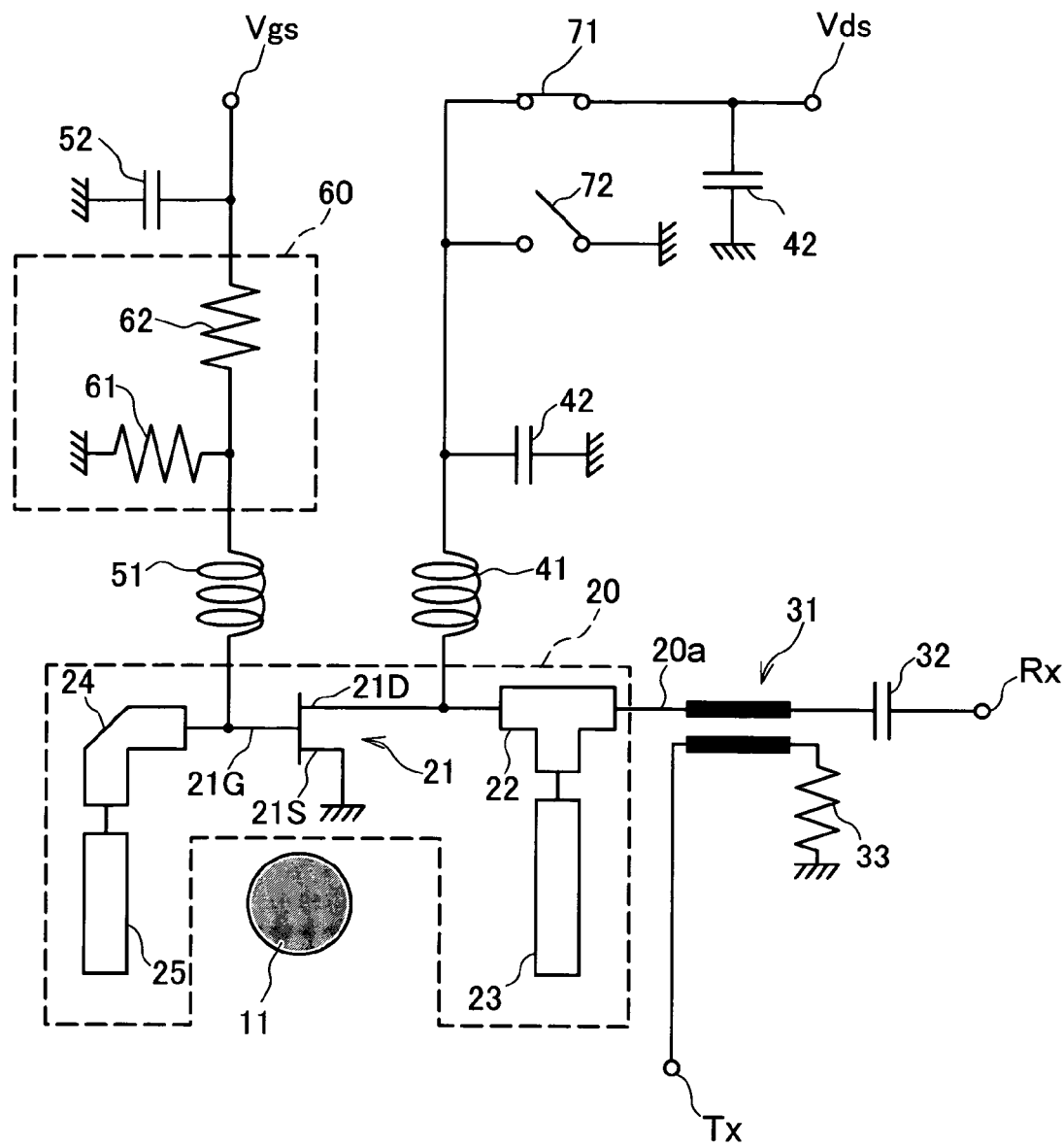
FIG. 5 is a circuit diagram of a dielectric resonator oscillator according to a preferred third embodiment of the present invention.

FIG. 5 is a circuit diagram of a dielectric resonator oscillator 500 according to a preferred third embodiment of the present invention.

As shown in FIG. 5, the dielectric resonator oscillator 500 according to the third embodiment has both the characteristic of the dielectric resonator oscillator 300 shown in FIG. 3 and the characteristic of the dielectric resonator oscillator 400 shown in FIG. 4. That is, the dielectric resonator oscillator 500 has a configuration in which the switches 71 and 72 are provided, and the capacitor 42 for removing noise is provided on the power terminal Vds side as seen from the switch 71.

According to the third embodiment, the effect due to the dielectric resonator oscillator 300 shown in FIG. 3, that is, the fall time reduction effect, and the effect due to the dielectric resonator oscillator 400 shown in FIG. 4, that is, the rise time reduction effect can be obtained. Accordingly, when the resonance frequency is about 24 GHz, the fall time can be reduced to about 3 μsec and the rise time can be reduced to about 8 μsec.

Figure 6:
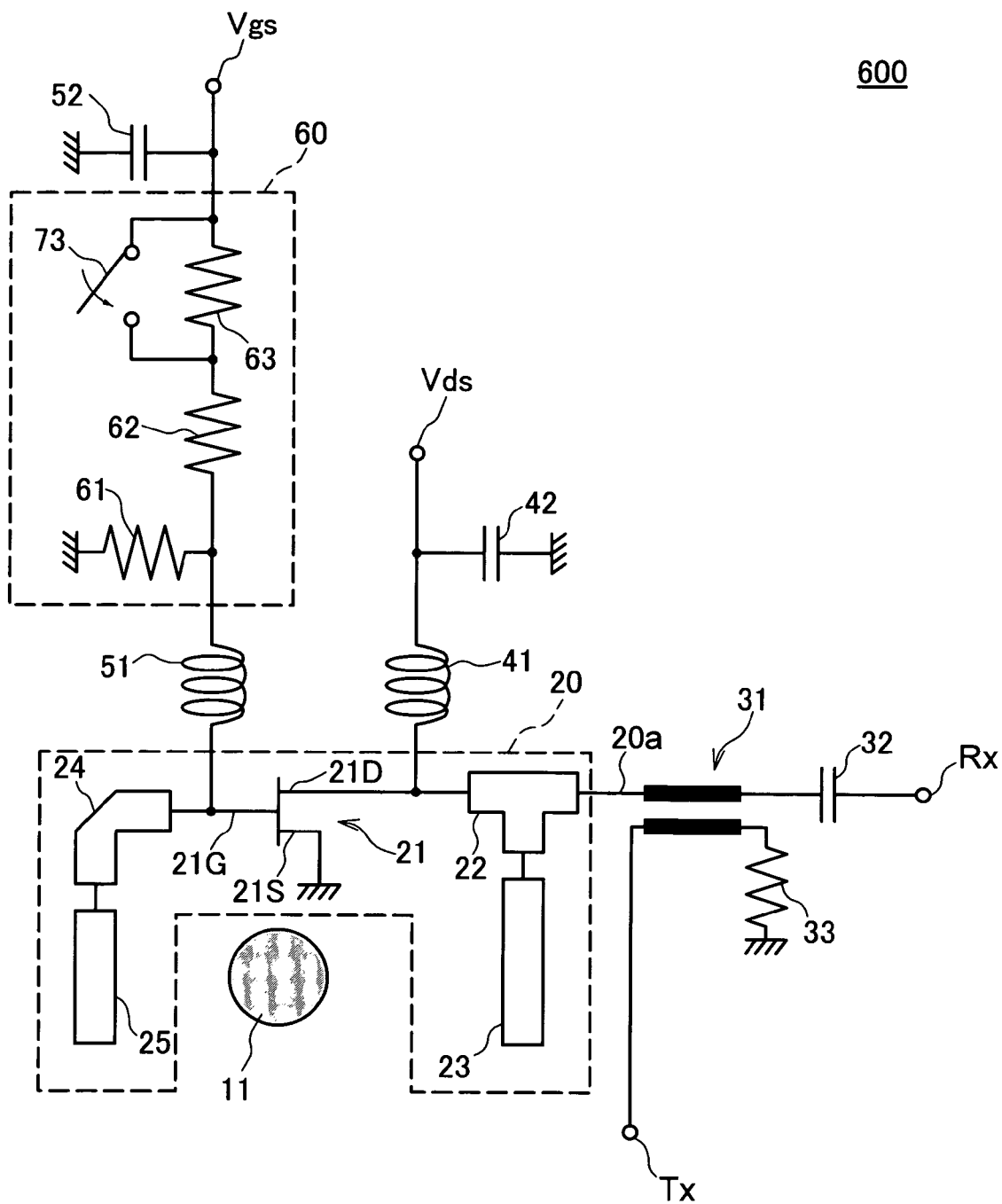
FIG. 6 is a circuit diagram of a dielectric resonator oscillator according to a preferred fourth embodiment of the present invention.

FIG. 6 is a circuit diagram of a dielectric resonator oscillator 600 according to a preferred fourth embodiment of the present invention.

As shown in FIG. 6, the dielectric resonator oscillator 600 according to the fourth embodiment has a configuration in which a switch 73 and resistances 63 are connected in parallel are added in the voltage divider circuit 60 with respect to the dielectric resonator oscillator 100 shown in FIG. 1. Other components are the same as in the dielectric resonator oscillator 100 shown in FIG. 1, and hence, like reference numerals are designated to refer to like components, and redundant explanation is omitted.

The switch 73 is turned off in the period during which the oscillation operation is performed, and turned on in the period during which the oscillation operation is stopped. Since the resistances 61 to 63 are serially connected between the power terminal Vgs and the ground potential, if resistance values of the resistances 61 to 63 are assumed to be $R_{61}$ to $R_{63}$, when the switch 73 is in the OFF state, voltage $V_{OFF}$ to be applied to the gate 21G of the transistor 21 becomes as follows:

$$V_{OFF} = Vgs \times R_{61}/(R_{61}+R_{62}+R_{63})$$

On the other hand, when the switch 73 is in the ON state, the added resistance 63 is short-circuited. Therefore, voltage $V_{ON}$ to be applied to the gate 21G of the transistor 21 changes to as follows:

$$V_{ON} = Vgs \times R_{61}/(R_{61}+R_{62})$$

Accordingly, if the resistance values $R_{61}$ to $R_{63}$ of the resistances 61 to 63 are set such that the drive circuit 20 is changed to the operated state by the voltage $V_{OFF}$, or to the operation stopped state by the voltage $V_{ON}$, the oscillation operation can be started or stopped quite quickly by ON/OFF of the switch 73.

Figure 7:
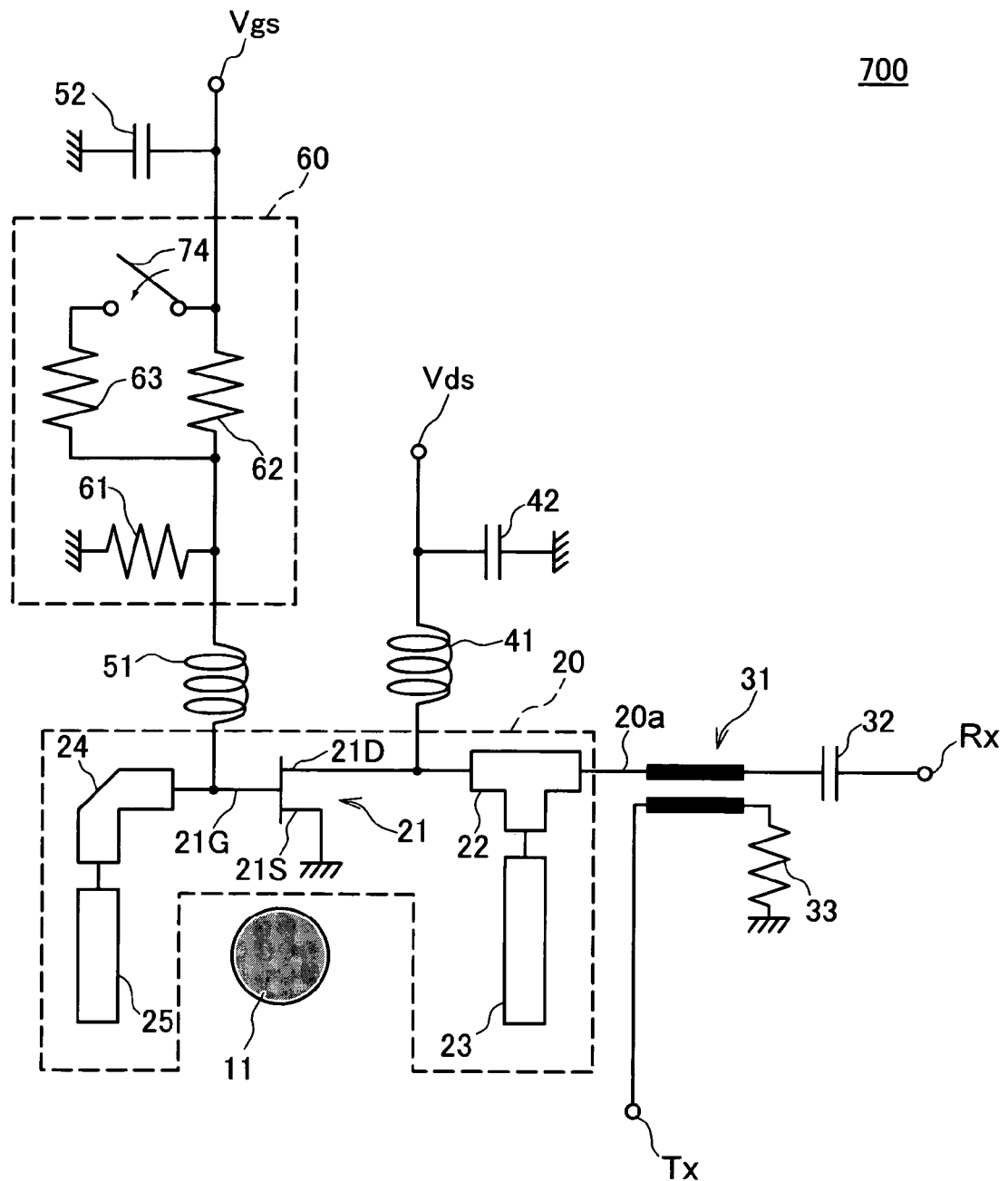
FIG. 7 is a circuit diagram of a dielectric resonator oscillator according to a preferred fifth embodiment of the present invention.

FIG. 7 is a circuit diagram of a dielectric resonator oscillator 700 according to a preferred fifth embodiment of the present invention.

As shown in FIG. 7, the dielectric resonator oscillator 700 according to the fifth embodiment has a configuration in which a resistance 63 and a switch 74 serially connected to the resistance 63 are added in the voltage divider circuit 60 with respect to the dielectric resonator oscillator 100 shown in FIG. 1. Other components are the same as in the dielectric resonator oscillator 100 shown in FIG. 1, and hence, like reference numerals are designated to refer to like components, and redundant explanation is omitted.

The switch 74 is turned off in the period during which the oscillation operation is performed, and turned on in the period during which the oscillation operation is stopped. Since the resistances 62 and 63 are connected in parallel between the power terminal Vgs and the gate 21G of the transistor 21, if resistance values of the resistances 61 to 63 are assumed to be $R_{61}$ to $R_{63}$, when the switch 74 is in the OFF state, the voltage $V_{OFF}$ to be applied to the gate 21G of the transistor 21 becomes as follows:

$$V_{OFF} = Vgs \times R_{61}/(R_{61}+R_{62})$$

When the switch 74 is in the ON state, the voltage VON to be applied to the gate 21G of the transistor 21 becomes as follows:

$$V_{ON} = Vgs \times \frac{R_{61}}{R_{61} + \frac{R_{62} \times R_{63}}{R_{62} + R_{63}}}$$

Accordingly, also in the fifth embodiment, if the resistance values $R_{61}$ to $R_{63}$ of the resistances 61 to 63 are set such that the drive circuit 20 is changed to the operated state by the voltage $V_{OFF}$, or to the operation stopped state by the voltage $V_{ON}$, the oscillation operation can be started or stopped quite quickly by ON/OFF of the switch 74.

Figure 8:
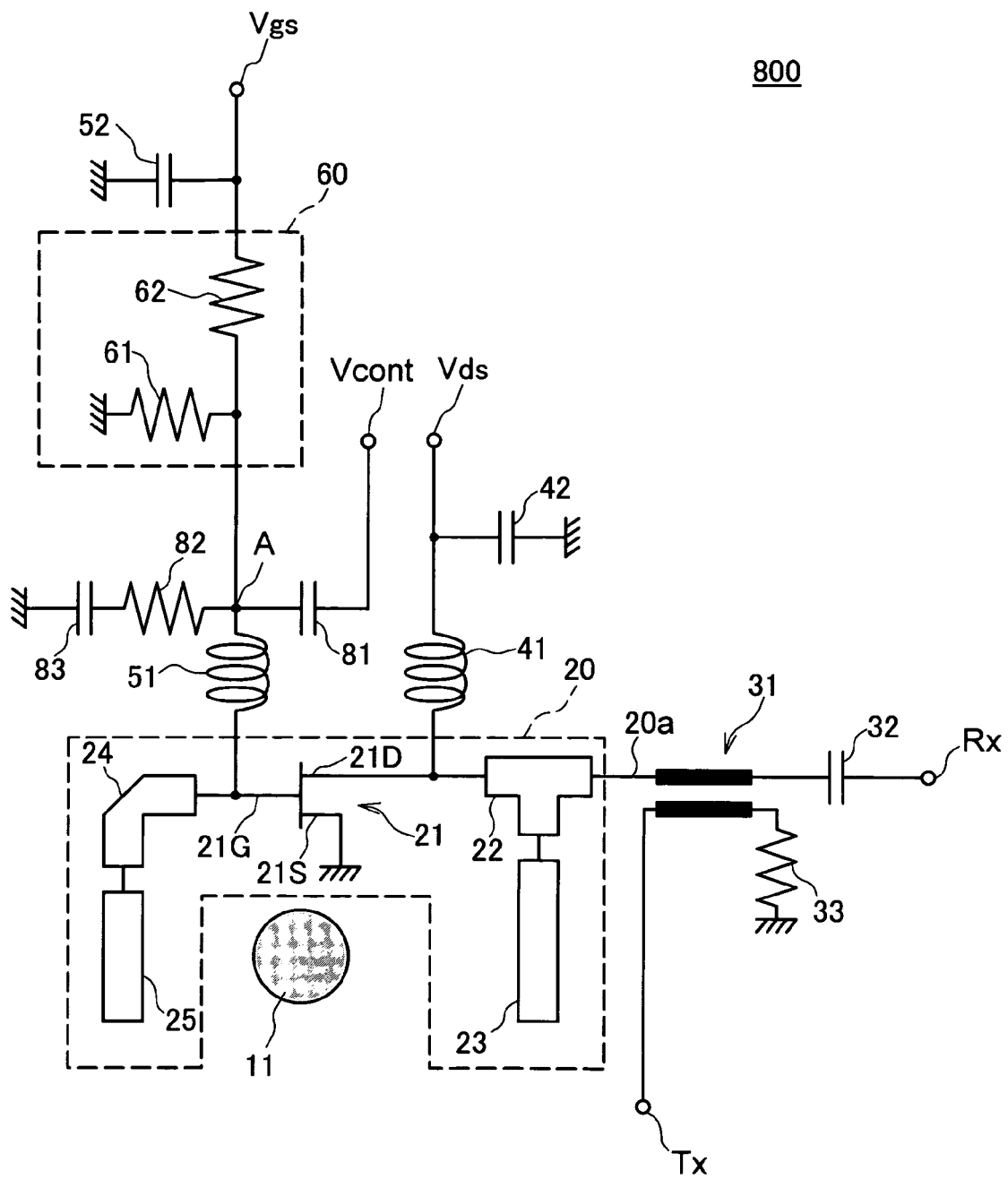
FIG. 8 is a circuit diagram of a dielectric resonator oscillator according to a preferred sixth embodiment of the present invention.

FIG. 8 is a circuit diagram of a dielectric resonator oscillator 800 according to a preferred sixth embodiment of the present invention.

As shown in FIG. 8, the dielectric resonator oscillator 800 according to the sixth embodiment has a configuration in which a capacitor 81 connected between a node A and a control terminal Vcont, and a resistance 82 and a capacitor 83 serially connected between the node A and the ground potential are added with respect to the dielectric resonator oscillator 100 shown in FIG. 1. Other components are the same as in the dielectric resonator oscillator 100 shown in FIG. 1, and hence, like reference numerals are designated to refer to like components, and redundant explanation is omitted.

Figure 9A:
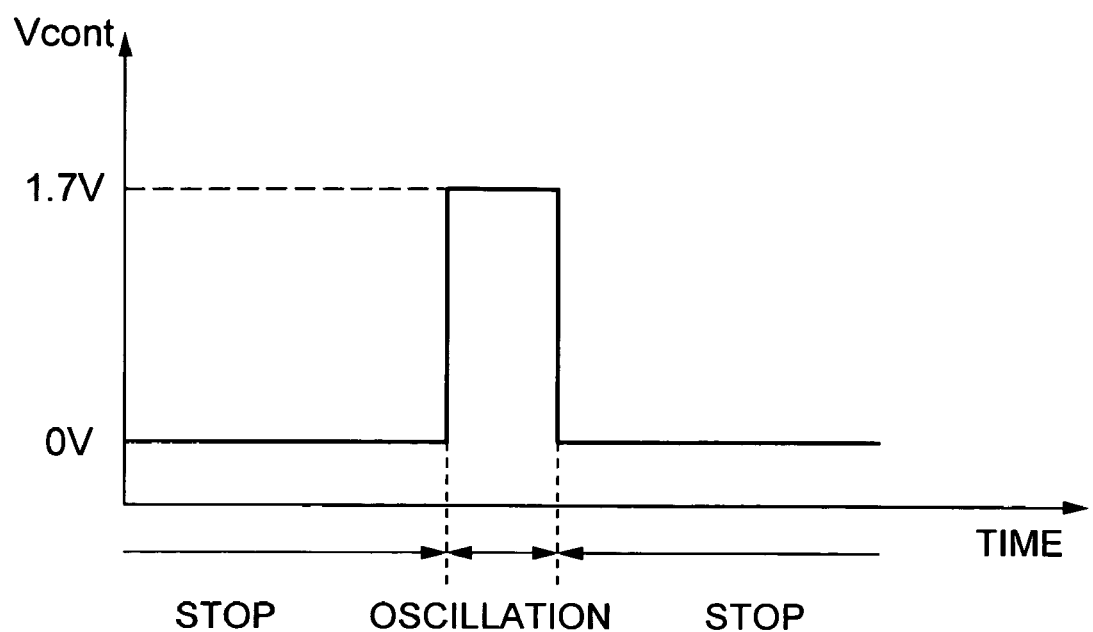
FIG. 9A shows a voltage waveform at a control terminal Vcont.

The control terminal Vcont is a terminal for changing the voltage applied to the gate 21G of the transistor 21, and as an example, when the dielectric resonator 11 is to be oscillated, a voltage of 1.7V is applied, and when oscillation of the dielectric resonator 11 is stopped, a voltage of 0V is applied. Therefore, the voltage at the control terminal Vcont has a pulse-like waveform as shown in FIG. 9A.

The capacitors 81 and 83 are for cutting direct current, and the resistance 82 is for preventing overshoot or undershoot occurring at the time of voltage change of the control terminal Vcont. The role of the resistance 82 can be also performed by the resistance 61, and in this case, the resistance 82 and the capacitor 83 are not required. However, in order to eliminate the resistance 82 and the capacitor 83, it is necessary to set the resistance values of the resistances 61 and 62 to be low, thereby increasing the power consumption.

Figure 9B:
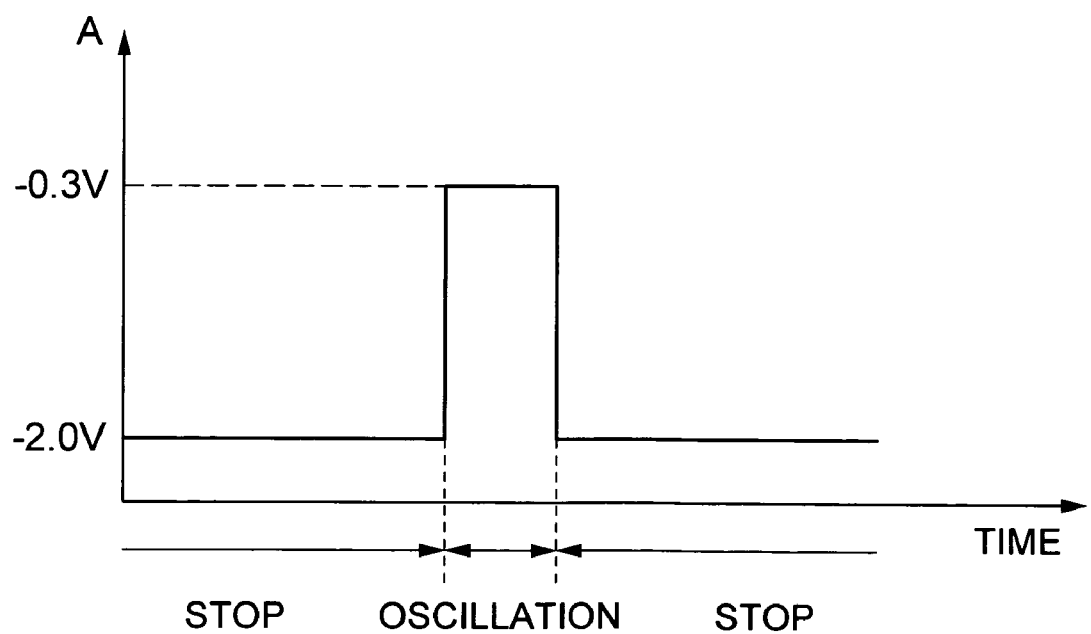
FIG. 9B shows a voltage waveform at a node A.

If the voltage of the control terminal Vcont is changed, the voltage at the node A also changes as shown in FIG. 9B. Therefore, if the resistance values of the resistances 61 to 63 are set such that when the control terminal Vcont is high level (for example, 1.7V), the drive circuit 20 becomes the operated state (for example, the node A=−0.3V), and when the control terminal Vcont is low level (for example, 0V), the drive circuit 20 becomes the operation stopped state (for example, the node A =−2.0V), the oscillation operation can be started or stopped quite quickly, synchronizing with the voltage change of the control terminal Vcont.

According to the sixth embodiment, since a switch for starting or stopping the oscillation operation is not required, the circuit configuration can be further simplified.

The present invention is in no way limited to the aforementioned embodiments, but rather various modifications are possible within the scope of the invention as recited in the claims, and naturally these modifications are included within the scope of the invention.

For example, in the respective embodiments above, the HEMT transistor 21 is used as the transistor used for the drive circuit 20, but it is not essential in the present invention, and other types of transistor such as a bipolar transistor can be used.

In the respective embodiments, the dielectric resonator 11 is arranged between the signal lines 23 and 25, but the arrangement thereof is not limited thereto in the present invention, and for example, the dielectric resonator 11 can be coupled only to one of the signal lines 23 and 25.

Furthermore, in the dielectric resonator oscillators 300, 400, and 500 according to the first to the third embodiments, a switch is provided on the drain 21D side of the transistor 21, and in the dielectric resonator oscillators 600 and 700 according to the fourth to the sixth embodiments, a switch is provided on the gate 21G side of the transistor 21. However, the switch can be provided on both sides of the drain 21D and the gate 21G.

According to the present invention, at least one of the rise time and the fall time of the dielectric resonator oscillator can be reduced. Accordingly, if the dielectric resonator oscillator according to the present invention is used as an oscillation circuit for the radar apparatus using the pulse modulation method, when intermittent operation is performed, the period during which oscillation is actually generated can be reduced than in the conventional dielectric resonator oscillator. As a result, the influence of interference on other radar apparatuses can be considerably reduced.

What is claimed is:

1. A dielectric resonator oscillator, comprising:
a dielectric resonator;
a drive circuit for applying a resonance voltage to the dielectric resonator;
a means for applying a first voltage required for generating the resonance voltage and a second voltage for stopping generation of the resonance voltage to the drive circuit;
wherein said drive circuit includes a transistor, a first signal line connected to a controlled electrode of the transistor, and a second signal line connected to a control electrode of the transistor;
wherein said applying means includes a first switch provided between the controlled electrode of the transistor and a first power terminal to which the first voltage is supplied, and a second switch provided between the controlled electrode of the transistor and a second power terminal to which the second voltage is supplied, and
wherein said first and second switches are made conductive exclusively.

2. The dielectric resonator oscillator as claimed in claim 1, further comprises a capacitor for removing noise generated by the drive circuit, connected to the first power terminal side as seen from the first switch.

3. The dielectric resonator oscillator as claimed in claim 1, wherein said applying means includes a voltage divider circuit provided between the control electrode of the transistor and a third power terminal, and a third switch for turning a partial voltage ratio of the voltage divider circuit.

4. The dielectric resonator oscillator as claimed in claim 3, wherein said voltage divider circuit includes first and second resistances connected in serial between the control electrode of the transistor and the third power terminal, and the third switch being connected to the first resistance in parallel.

5. The dielectric resonator oscillator as claimed in claim 3, wherein said voltage divider circuit includes first and second resistances connected in parallel between the control electrode of the transistor and the third power terminal, and the third switch being connected to the first resistance in serial.

6. The dielectric resonator oscillator as claimed in claim 1, wherein said applying means includes a control terminal connected to the control electrode of the transistor for controlling the start and suspension of the oscillation operation due to a voltage change.

7. The dielectric resonator oscillator as claimed in claim 6, wherein said applying means further includes a first capacitor connected between the control terminal and the control electrode of the transistor.

8. The dielectric resonator oscillator as claimed in claim 7, wherein said applying means further includes a second capacitor and a resistance connected in series between the first capacitor and a ground potential.

9. A dielectric resonator oscillator, comprising:
a dielectric resonator;
a drive circuit for applying a resonance voltage to the dielectric resonator;
a means for applying a first voltage required for generating the resonance voltage and a second voltage for stopping generation of the resonance voltage to the drive circuit;
wherein said drive circuit includes a transistor, a first signal line connected to a controlled electrode of the transistor, and a second signal line connected to a control electrode of the transistor, and
wherein said applying means includes a voltage divider circuit provided between the control electrode of the transistor and a third power terminal, and a third switch for turning a partial voltage ratio of the voltage divider circuit.

10. The dielectric resonator oscillator as claimed in claim 9, wherein said applying means includes a first switch provided between the controlled electrode of the transistor and a first power terminal to which the first voltage is supplied, and a second switch provided between the controlled electrode of the transistor and a second power terminal to which the second voltage is supplied,
wherein said first and second switches are made conductive exclusively.

11. The dielectric resonator oscillator as claimed in claim 10, further comprises a capacitor for removing noise generated by the drive circuit, connected to the first power terminal side as seen from the first switch.

12. The dielectric resonator oscillator as claimed in claim 9, wherein said voltage divider circuit includes first and second resistances connected in serial between the control electrode of the transistor and the third power terminal, and the third switch being connected to the first resistance in parallel.

13. The dielectric resonator oscillator as claimed in claim 9, wherein said voltage divider circuit includes first and second resistances connected in parallel between the control electrode of the transistor and the third power terminal, and the third switch being connected to the first resistance in serial.

14. The dielectric resonator oscillator as claimed in claim 9, wherein said applying means includes a control terminal connected to the control electrode of the transistor for controlling the start and suspension of the oscillation operation due to a voltage change.

15. The dielectric resonator oscillator as claimed in claim 14, wherein said applying means further includes a first capacitor connected between the control terminal and the control electrode of the transistor.

16. The dielectric resonator oscillator as claimed in claim 15, wherein said applying means further includes a second capacitor and a resistance connected in series between the first capacitor and a ground potential.

17. A dielectric resonator oscillator, comprising:
a dielectric resonator;
a drive circuit for applying a resonance voltage to the dielectric resonator;
a means for applying a first voltage required for generating the resonance voltage and a second voltage for stopping generation of the resonance voltage to the drive circuit;
wherein said drive circuit includes a transistor, a first signal line connected to a controlled electrode of the transistor, and a second signal line connected to a control electrode of the transistor, and
wherein said applying means includes a control terminal connected to the control electrode of the transistor for controlling the start and suspension of the oscillation operation due to a voltage change.

18. The dielectric resonator oscillator as claimed in claim 17, wherein said applying means includes a first switch provided between the controlled electrode of the transistor and a first power terminal to which the first voltage is supplied, and a second switch provided between the controlled electrode of the transistor and a second power terminal to which the second voltage is supplied,
wherein said first and second switches are made conductive exclusively.

19. The dielectric resonator oscillator as claimed in claim 18, further comprises a capacitor for removing noise generated by the drive circuit, connected to the first power terminal side as seen from the first switch.

20. The dielectric resonator oscillator as claimed in claim 17, wherein said applying means includes a voltage divider circuit provided between the control electrode of the transistor and a third power terminal, and a third switch for turning a partial voltage ratio of the voltage divider circuit.

21. The dielectric resonator oscillator as claimed in claim 20, wherein said voltage divider circuit includes first and second resistances connected in serial between the control electrode of the transistor and the third power terminal, and the third switch being connected to the first resistance in parallel.

22. The dielectric resonator oscillator as claimed in claim 20, wherein said voltage divider circuit includes first and second resistances connected in parallel between the control electrode of the transistor and the third power terminal, and the third switch being connected to the first resistance in serial.

23. The dielectric resonator oscillator as claimed in claim 17, wherein said applying means further includes a first capacitor connected between the control terminal and the control electrode of the transistor.

24. The dielectric resonator oscillator as claimed in claim 23, wherein said applying means further includes a second capacitor and a resistance connected in series between the first capacitor and a ground potential.

* * * * *